United States Patent
Foletto et al.

(10) Patent No.: US 9,605,975 B2
(45) Date of Patent: Mar. 28, 2017

(54) MAGNETIC FIELD SENSOR FOR ORIENTATION INDEPENDENT SPEED AND DIRECTION MEASUREMENT

(71) Applicant: Allegro Microsystems, LLC, Worcester, MA (US)

(72) Inventors: Andrea Foletto, Annecy (FR); Andreas P. Friedrich, Metz-Tessy (FR)

(73) Assignee: ALLEGRO MICORSYSTEMS, LLC, Worcester, MA (US)

( * ) Notice: Subject to any disclaimer, the term of this patent is extended or adjusted under 35 U.S.C. 154(b) by 31 days.

(21) Appl. No.: 14/731,967

(22) Filed: Jun. 5, 2015

(65) Prior Publication Data

US 2016/0356628 A1    Dec. 8, 2016

(51) Int. Cl.
| | | |
|---|---|---|
| G01D 5/14 | (2006.01) |
| G01D 5/16 | (2006.01) |
| G01R 33/07 | (2006.01) |
| G01R 33/09 | (2006.01) |

(52) U.S. Cl.
CPC .............. *G01D 5/142* (2013.01); *G01D 5/16* (2013.01); *G01R 33/072* (2013.01); *G01R 33/091* (2013.01)

(58) Field of Classification Search
CPC combination set(s) only.
See application file for complete search history.

(56) References Cited

U.S. PATENT DOCUMENTS

| | | |
|---|---|---|
| 5,241,267 A | 8/1993 | Gleixner et al. |
| 5,463,318 A | 10/1995 | Duret |
| 6,570,376 B2 | 5/2003 | Matsui et al. |
| 6,815,944 B2 | 11/2004 | Vig et al. |
| 6,882,142 B2 | 4/2005 | Koike et al. |
| 6,937,008 B2 | 8/2005 | Matsuzaki et al. |
| 7,026,808 B2 | 4/2006 | Vig et al. |
| 7,235,968 B2 | 6/2007 | Popovic et al. |

(Continued)

FOREIGN PATENT DOCUMENTS

| | | |
|---|---|---|
| DE | 10 2013 000430 | 7/2014 |
| DE | 10 2014 101025 | 7/2014 |

OTHER PUBLICATIONS

Response dated Feb. 12, 2014 to EPO communication with invitation to correct deficiencies noted in the Written Opinion, for EP Application No. 12712456.8; 23 pages.

(Continued)

*Primary Examiner* — Clayton E Laballe
*Assistant Examiner* — Jas Sanghera
(74) *Attorney, Agent, or Firm* — Daly, Crowley, Mofford & Durkee, LLP

(57) ABSTRACT

A magnetic field sensor that provides target speed and direction detection that is independent of sensor-to-target orientation includes at least three differential channels, each responsive to a pair of magnetic field sensing elements to generate a respective magnetic field channel signal. A combining element is configured to generate a combined signal based on the first, second, and third magnetic field channel signals and control circuitry responsive to the combined signal and to at least one of the first, second, and third magnetic field channel signals generates a sensor output signal that indicative of target speed and direction.

29 Claims, 6 Drawing Sheets

(56) References Cited

U.S. PATENT DOCUMENTS

| | | | |
|---|---|---|---|
| 7,365,530 B2 | 4/2008 | Bailey et al. | |
| 7,592,801 B2 | 9/2009 | Bailey et al. | |
| 7,622,914 B2 | 11/2009 | Bailey et al. | |
| 7,772,838 B2 | 8/2010 | Bailey et al. | |
| 2003/0173955 A1 | 9/2003 | Uenoyama | |
| 2008/0278158 A1 | 11/2008 | Granig et al. | |
| 2009/0058404 A1 | 3/2009 | Kurumado | |
| 2010/0007340 A1 | 1/2010 | Kaita et al. | |
| 2010/0026282 A1 | 2/2010 | Kaita et al. | |
| 2010/0181993 A1 | 7/2010 | Fernandez et al. | |
| 2011/0048102 A1 | 3/2011 | Fernandez et al. | |
| 2011/0074406 A1 | 3/2011 | Mather et al. | |
| 2012/0025817 A1 | 2/2012 | Romero et al. | |
| 2012/0249133 A1* | 10/2012 | Friedrich | G01R 33/0005 324/247 |
| 2015/0130452 A1* | 5/2015 | Nishioka | G01D 5/147 324/207.25 |

OTHER PUBLICATIONS

Office Action dated Jun. 20, 2014 for EP Application No. 12712456.8; 4 pages.
Response to Office Action filed Dec. 29, 2014 for EP Application No. 12712456.8; 20 pages.
Office Action with English translation dated Dec. 11, 2014 for Japanese Application No. 2014-502594; 6 pages.
Response to Office Action with English Claims filed Mar. 11, 2015 for Japanese Application No. 2014-502594; 14 pages.
Notice of Allowance with English Allowed Claims dated Apr. 6, 2015 for Japanese Application No. 2014-502594; 9 pages.
Search Report and Written Opinion dated May 29, 2012 for PCT Application No. PCT/US2012/028164; 18 pages.
International Preliminary Report on Patentability dated Oct. 10, 2013 for PCT Application No. PCT/US2012/028164; 14 pages.
Allegro Datasheet ATS657, "Dynamic, Self-Calibrating, Threshold-Detecting, Differential Speed and Direction Hall-Effect Gear tooth Sensor IC," 2009, 15 Pages.
Allegro Datasheet ATS682LSH, "Miniature, Two-wire, True Zero Speed Differential Peak-Detecting Sensor IC," 2009, 16 pages.
U.S. Appl. No. 13/078,200; 326 pages.
Notice of Allowance dated Mar. 23, 2016 for European Application No. 12712456.8; 6 pages.
Korean Office Action with English translation dated Apr. 18, 2016 for Korean Application No. 10-2013-7027428; 15 pages.
Response to Office Action dated Jun. 17, 2016 and letter to 21$^{st}$ Century dated Jun. 3, 2016 for Korean Application No. 10-2013-7027428; 41 pages.
Search Report and Written Opinion dated Aug. 25, 2016 for PCT Application No. PCT/US2016/032021; 11 pages.
PCT Article 19 Amendment filed Sep. 2, 2016 for PCT Application No. PCT/US2016/032021; 15 pages.
Korean Office Action with English translation dated Sep. 21, 2016 for Korean Application No. 10-2013-7027428; 5 pages.

* cited by examiner

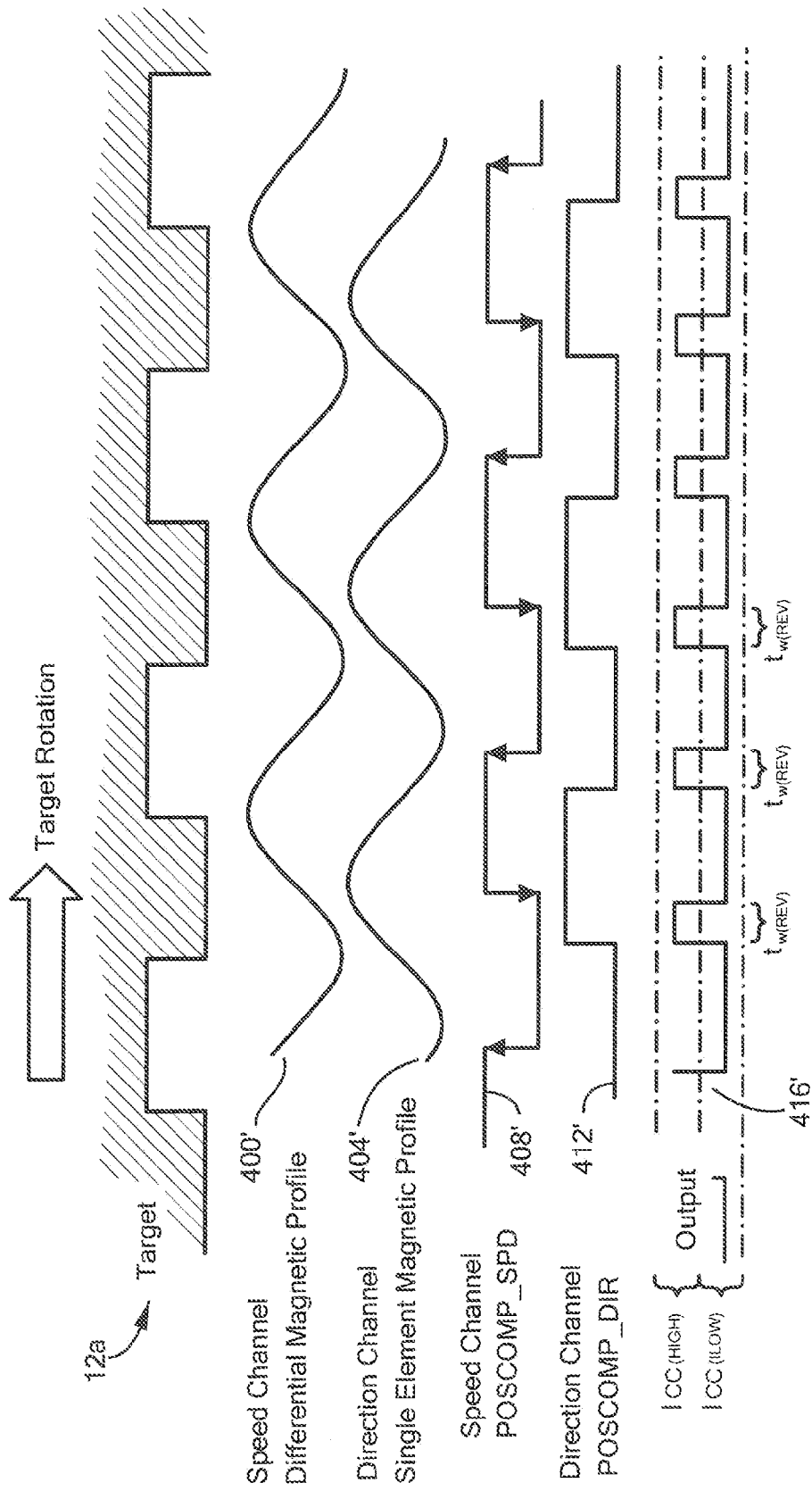

MAGNETIC FIELD SENSOR FOR ORIENTATION INDEPENDENT SPEED AND DIRECTION MEASUREMENT

CROSS-REFERENCE TO RELATED APPLICATIONS

Not applicable.

STATEMENT REGARDING FEDERALLY SPONSORED RESEARCH

Not applicable.

FIELD

This disclosure relates generally to magnetic field sensors and more particularly, to magnetic field sensors for speed and direction measurement,

BACKGROUND

Magnetic field sensors that sense motion of a target are known. The target can be a ferromagnetic target or a magnetic target (e.g. a ring magnet). Often, the sensed target motion is rotation. Such sensors detect features of the rotating target's profile, for example, teeth and valleys of a ferrous gear or north and south poles of a magnetic target such as a ring magnet.

The magnetic field associated with the target profile is sensed by a magnetic field sensing element, such as Hall element or magnetoresistive (MR) element. As the target passes the sensing element, the magnetics field experienced by the sensing element varies in relation to the target profile. The sensing element provides a signal proportional to the sensed magnetic field and the sensor processes the magnetic field signal to generate an output, for example, a signal that changes state each time the magnetic field signal crosses a threshold. Such an output can be used to provide rotational speed information. A second sensing element can be employed to generate an output for rotational direction detection as well.

Some sensors, referred to as differential sensors, contain two sensing elements configured in a differential arrangement. In differential magnetic field sensors, the difference between the signals provided by the two sensing elements is used to generate a differential magnetic field signal indicative of the target's features. As the differential magnetic field sensor only responds to changes in magnetic field strength, it is relatively immune to interference. Differential sensors containing three or more sensing elements can be used to provide rotational speed and direction information.

Unlike the non-differential sensing type magnetic field sensor, the differential magnetic field sensor is orientation dependent with respect to the target. Thus, when a differential magnetic field sensor is used to measure the speed (or direction) of a rotating target, the pair of sensing elements has to be centered over the target's profile for optimum performance. Misalignment of the sensing elements relative to the target profile results in a reduction of the peak-to-peak signal. Consequently, applications that cannot control the sensor-to-target alignment usually employ a non-differential sensing type sensor.

SUMMARY

A magnetic field sensor includes at least first, second, and third spaced magnetic field sensing elements, each providing a respective first, second, and third magnetic field signal having an amplitude proportional to a magnetic field associated with a target. The sensor includes a first differential channel comprising a first pair of the first, second, and third magnetic field sensing elements and configured to provide a first channel signal based on a difference between the magnetic field signals provided by the first pair of magnetic field sensing elements, a second differential channel comprising a second pair of the first, second, and third magnetic field sensing elements and configured to provide as second channel signal based on a difference between the magnetic field signals provided by the second pair of magnetic field sensing elements, and a third differential channel comprising a third pair of the first, second, and third magnetic field sensing elements and configured to provide a third channel signal based on a difference between the magnetic field signals provided by the third pair of magnetic field sensing elements. A combining element is provided to generate a combined signal based on the first, second, and third magnetic field signals and control circuitry, responsive to the combined signal and to at least one of the first, second, and third channel signals, generates a sensor output signal that is indicative of a speed of motion and a direction of motion of the target and that is independent of an installation angle of the magnetic field sensor relative to the target.

Features may include one or more of the following. The control circuitry may include an orientation independent speed detector to generate a speed channel signal in response to at least one of the first, second, and third channel signals and an orientation independent direction detector responsive to the combined signal to generate a direction channel signal. The orientation independent speed detector may include a peak-to-peak signal detector and a comparator configured to detect which of the first, second, and third channel signals has a largest peak-to-peak amplitude and wherein the one of the first, second, and third channel signals with the largest peak-to-peak amplitude is processed to provide the speed channel signal.

One of the magnetic field sensing elements in each of the first and second pairs of magnetic field sensing elements may be shared by the first and second differential channels or alternatively, none of the magnetic field sensing elements in each of the first and second pairs of magnetic field sensing elements may be shared by the first and second differential channels. In some embodiments, the spacing between each of the first, second, and third magnetic field sensing elements is substantially the same in one configuration, the first and second magnetic field sensing elements define a first axis, the second and third magnetic field sensing elements define a second axis, and the first and second axes are at a substantially sixty degree angle with respect to each other.

The orientation independent direction detector may include an encoder responsive to the speed channel signal and to the direction channel signal to generate a direction indicator signal indicating a first direction of motion of the target when the direction channel signal is in a first state as the speed channel signal transitions in a predetermined direction and indicating a second direction of motion of the target when the direction channel signal is in a second state as the speed channel signal transitions in the predetermined direction. The direction channel signal may be in the first state when the direction channel signal is greater than a predetermined threshold and in a second state when the direction channel signal is less than the predetermined threshold. In an embodiment, the predetermined threshold is proportional to a peak-to-peak amplitude of the largest one of the first, second, and third channel signals.

In an embodiment, the sensor output signal has transitions occurring, at a frequency indicative of the speed of motion of the target and a pulse width indicative of the direction of motion of the target. Alternatively, the sensor output signal may encode the speed of option and the direction of motion of the target in a protocol selected for example from Inter-Integrated Circuit (I²C), Serial Peripheral interface (SPI), Single Edge Nibble Transmission (SENT). The magnetic field sensing elements may take various forms such as a Hall-effect element, a magnetoresistance (MR) element, or other type of magnetic field sensitive element and may comprise a material selected from a IV-type semiconductor material or a III-V-type semiconductor material.

Also described is a method for sensing a speed and direction of motion of a target relative to a magnetic field sensor including providing at least first, second, and third spaced magnetic field sensing elements, each providing a respective first, second, and third magnetic field signal having an amplitude proportional to a magnetic field associated with the target, processing a first pair of the first, second, and third magnetic field signals to provide a first channel signal based on a difference between the first pair of the first, second, and third magnetic field signals, processing a second pair of the first, second, and third magnetic field signals to provide a second channel signal based on a difference between the second pair of the first, second, and third magnetic field signals, and processing a third pair of the first, second, and third magnetic field signals to provide a third channel signal based on a difference between the third pair of the first, second, and third magnetic field signals. The method further includes combining at least two of the first, second, and third magnetic field signals to generate a combined signal and providing an indication of the speed and direction of motion of the target in response to at least one of the first, second, and third channel signals and the combined signal, wherein the speed and direction indication is independent of an installation angle of the magnetic field sensor relative to the target.

The method may include determining which of the first, second, and third channel signals has a largest peak-to-peak amplitude and providing the speed and direction indication in response to the combined signal and the largest of the first, second, and third channel signals. In an embodiment, providing the speed and direction indication includes using the combined signal to generate a direction channel signal, using the largest of the first, second, and third channel signals to generate a speed channel signal, indicating a first direction of motion of the target when the direction channel signal is in a first state as the speed channel signal transitions in a predetermined direction, and indicating a second direction of motion of the target when the direction channel signal is in a second state as the speed channel signal transitions in the predetermined direction.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention.

FIG. 6 shows several illustrative waveforms associated with the magnetic field sensor of FIGS. 1-3 when the target is moving in a second direction.

DETAILED DESCRIPTION

Figure 1:
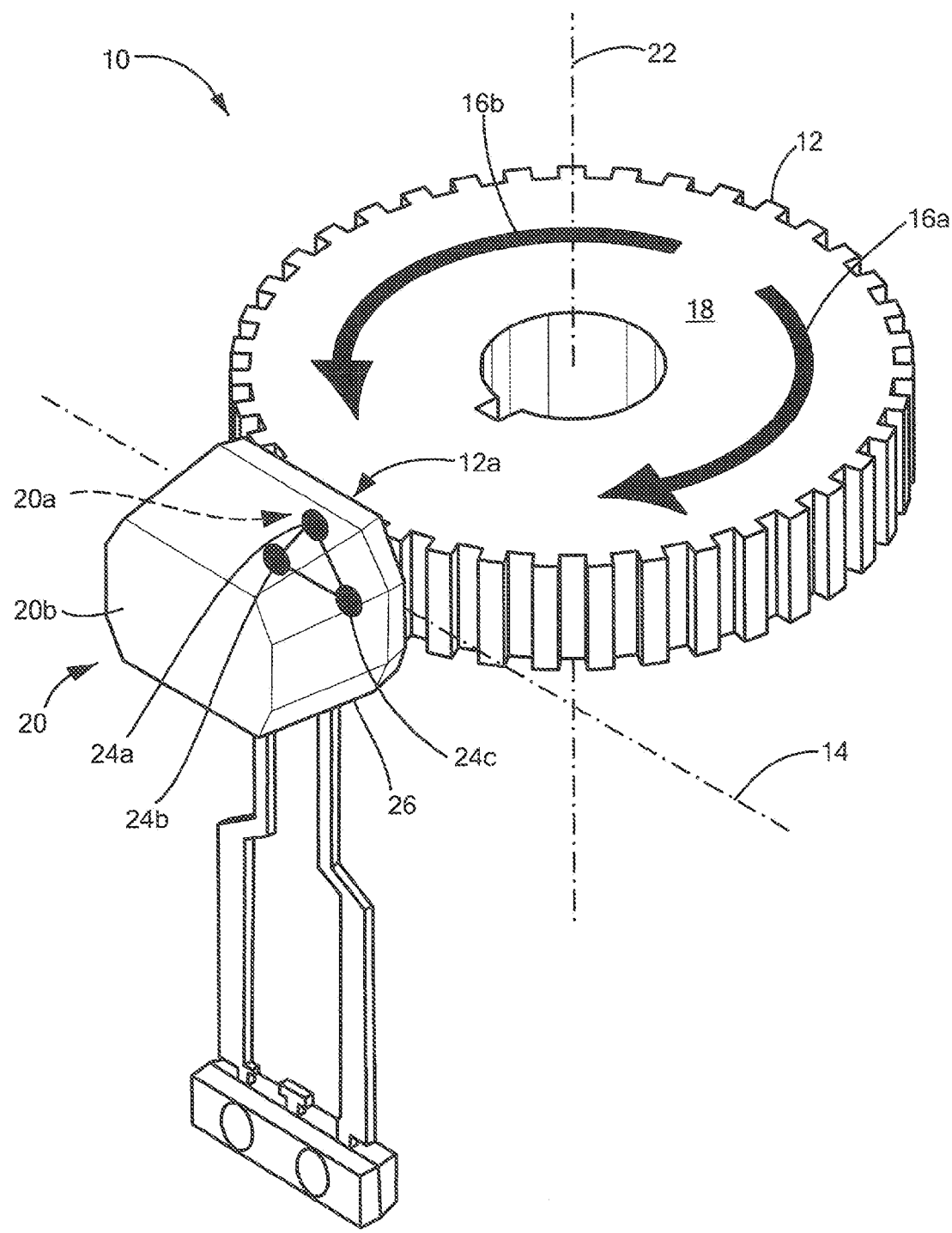
FIG. 1 is a pictorial representation of an exemplary magnetic field sensor that includes three sensing elements configured for orientation independent speed and direction sensing.

The features and other details of the disclosure will now be more particularly described. It will be understood that any specific embodiments described herein are shown by way of illustration and not as limitations of the concepts, systems, and techniques described herein. The principal features of this disclosure can be employed in various embodiments without departing is from the scope of the concepts sought to be protected.

For convenience, certain introductory concepts and terms used in the specification are collected here.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing magnetic or ferromagnetic articles, for example, magnetic domains of a ring magnet or a ferromagnetic target (e.g., gear teeth) where the magnetic field sensor may be used in combination with a back-biased or other magnet, and a magnetic field sensor that senses a density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge, Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions stored in a memory device. A "processor" can perform the function, operation, or sequence of operations using digital values or using analog signals. In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be analog or digital, Referring to FIGS. 1 and 2, a sensing arrangement 10 includes a magnetic field sensor 20 arranged in a radial sensing position relative to a rotating target 12. The sensor 20 includes at least first, second, and third magnetic field sensing elements 24a, 24b, 24c, respectively, and circuitry to generate a sensor output signal that is indicative of a speed and a direction of motion of the target that is independent of an installation angle of the sensor 20 relative to the target 12.

The target 12 rotates about an axis of rotation 22 in a target rotation plane 184 face 20a a of the sensor 20 opposes a profile 12a of the rotating target 12. A first direction of rotation of the target 12 is indicated by arrow 16a and a second, opposite direction of rotation is indicated by arrow 16b. Such rotation directions may be referred to as positive and negative rotation or forward and reverse rotation. The designations of "positive" and "negative" and forward" and "reverse" are arbitrary and may be varied without departing from the spirit of the disclosure. The definition of which relative target rotation direction is forward and which is reverse depends on the position of the magnetic field sensor 20 relative to the rotating target 12. For a given position and rotation direction, the definition of forward and reverse can be programmed such that the device selects a specific pair of magnetic field sensing elements that determines the rotation direction for the given position. A mid-point of the height of the target profile 12a is labeled is reference axis 14.

Figure 2:
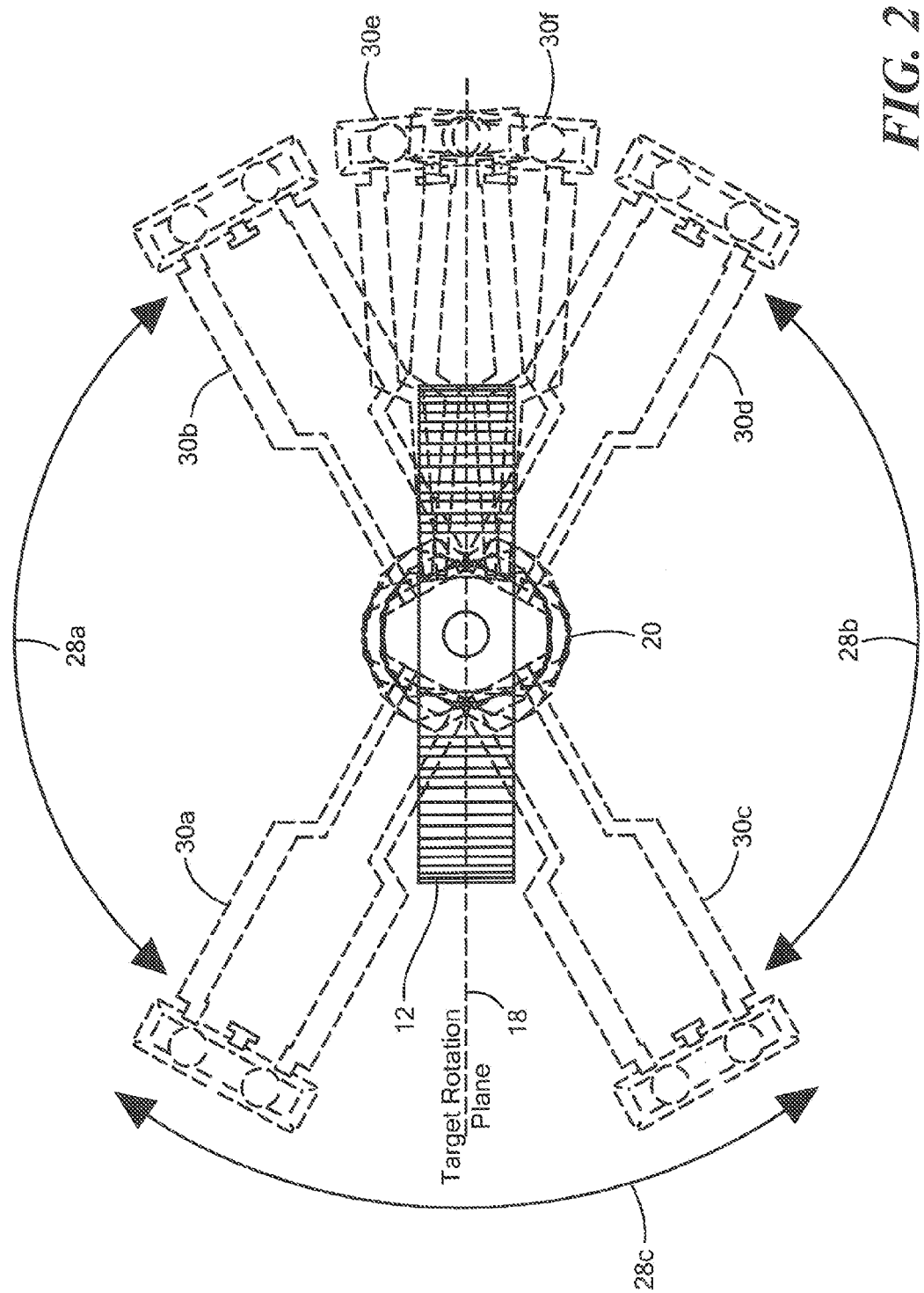
FIG. 2 is a plan view of the magnetic field sensor of FIG. 1 illustrating various installation angles.

The configuration of the magnetic field sensing elements 24a-24c and the sensor circuitry (FIG. 3) used to generate the orientation independent sensor output signal permits the sensor 20 to be installed at any angle in a plane perpendicular to the target rotation plane 18. This feature is illustrated in FIG. 2 which shows the sensor 20 (in dotted lines) in different angular positions (i.e., installation angles) relative to the target 12, here labeled positions 30a-30f. The term "orientation independent" as it is used herein to describe the sensor 20 and signals associated with the sensor means that the sensor and its output signal (including speed and direction information) is largely insensitive to the angle at which the sensor is positioned within the target rotation plane 18, although as explained above, the position of the sensor 20 relative to the target 12 will establish the definition of positive and negative rotation directions for example. With the described arrangements, both the speed and direction information provided by the sensor is largely insensitive to the angle at which the sensor is positioned (at installation time) and/or maintained (post-installation) relative to the target. Such tolerance of the orientation angle can greatly simplify sensor installation and maintenance, since manufacturing procedures and/or packaging designs required to meet the sensor-to-target alignment specifications are unnecessary.

Certain changes in the installation angle of the sensor relative to the target do not cause a direction indication change. More particularly, angle changes on the same side of the target rotation plane 18 (such as a change in the installation angle from position 30a to position 30b as indicated by arrow 28a or a change in the installation angle from position 30c to position 30d as indicated by arrow 28b) will not cause a direction indication change. Other installation angle changes that cross the target rotation plane 18 (such as a change in the installation angle from position to a to position 30c as indicated by arrow 28c) will cause a direction indication change.

The target 12 may be a magnetic or ferromagnetic object. The ferromagnetic object can be a magnetic object and the magnetic field detected by the magnetic field sensor 20 may be generated by the target itself and may vary depending on positions of the target relative to the sensor 20. Alternatively, a separate source of a magnetic field may be provided (e.g., a permanent magnet or hard ferromagnetic material) as part of, or adjacent to the magnetic field sensor 20 and the magnetic field detected by the sensor 20 may be altered by movement of the ferromagnetic object. Such a separate magnet may be provided in the sensor package 26 on a side of the sensing elements 24a-24c opposite to the target 12, as indicated by optional magnet 20b (FIG. 1).

Although the target 12 is shown in the form of a ferromagnetic gear in the example embodiment, the target may take other forms. For example, the target may take the form of a ring magnet having magnetic domains that are detected by the sensor 20. Additionally, the target 12 may be coupled to an automobile wheel, steering shaft, or a camshaft, as a few examples.

Figure 3:
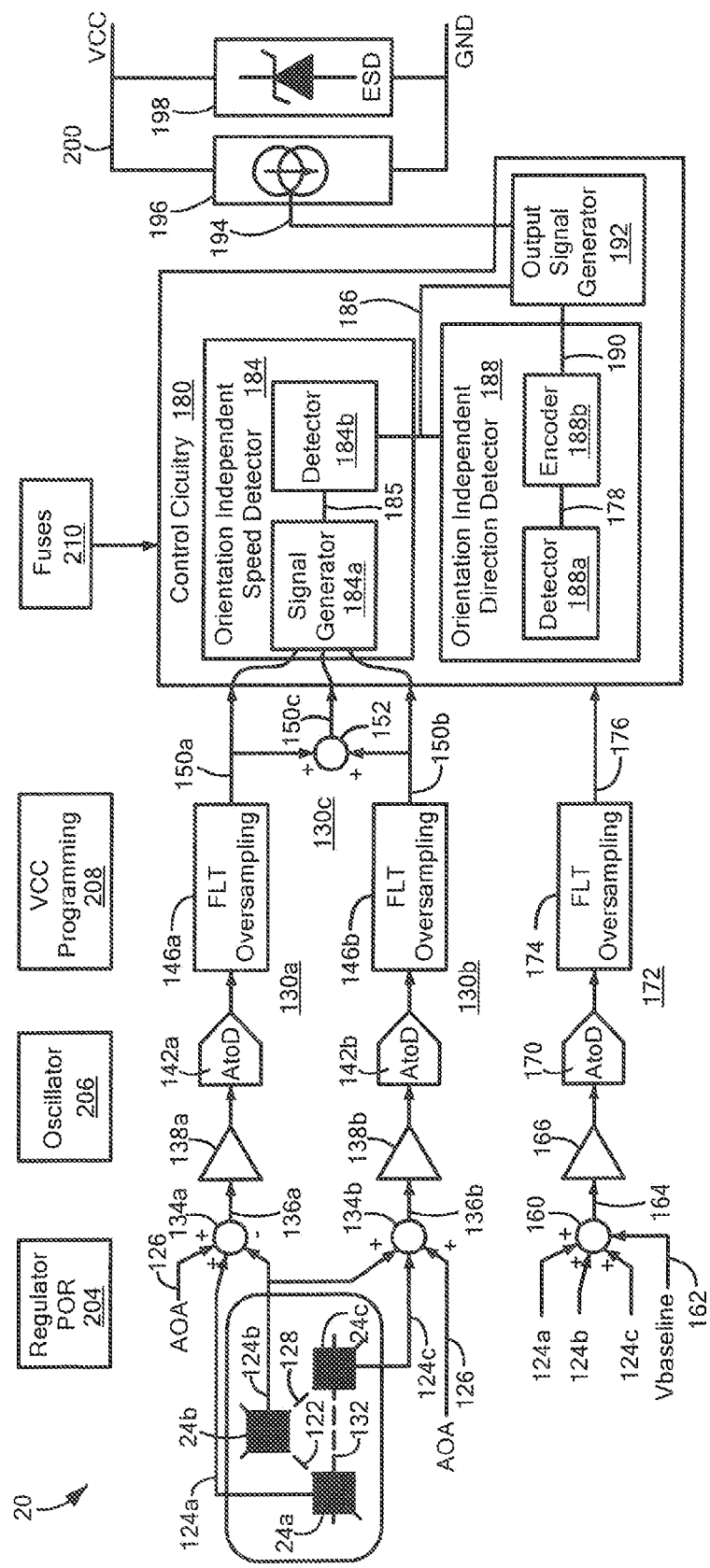
FIG. 3 is a block diagram of the magnetic field sensor of FIGS. 1 and 2 including three sensing elements and circuitry to generate a speed and direction signal.

Referring to FIG. 3, the magnetic field sensor 20 includes the first, second, and third magnetic field sensing elements 24a, 24b, and 24c, respectively, configured as described below. Each of the magnetic field sensing elements generates a respective magnetic field signal 124a, 124b, 124c having an amplitude proportional to a magnetic field affected by movement of the target 12.

A first differential channel 130a refers to circuitry that is responsive to the magnetic field signals from a first pair of the magnetic field sensing elements 24a-24c and that generates a first channel output signal 150a based on a difference between the magnetic field signals provided by the first pair of sensing elements (here elements 24a and 24b). Similarly, a second differential channel 130b includes circuitry that is responsive to a second pair of the magnetic field sensing elements 24a-24c to generate a second channel output signal 150b based on a difference between the magnetic field signals provided by the second pair of sensing elements (here elements 24b and 24c). And a third differential channel 130c includes circuitry that is responsive to a third pair of the magnetic field sensing elements 24a-24c to generate a third channel output signal 150c based on a difference between the magnetic field signals provided by the third pair of sensing elements (here elements 24c and 24a). The designations of "first", "second" and "third" as to the channels 130a-130c are arbitrary and indicate generally that each of the resulting channel output signals 150a-150c is indicative of the magnetic field sensed at a different respective location relative to the target 12.

The first differential channel 130a includes a summation element 134a as may be implemented with a differential amplifier, to generate a signal 136a based on a difference between the magnetic field signals provided by the first pair of magnetic field sensing elements, here sensing elements 24a and 24b. An automatic offset adjustment (AOA) signal 126 may be coupled to the summation element 134a to adjust the offset of the resulting signal 136a. A preamplifier 138a may be provided to generate an amplified (i.e., gain-adjusted) signal that is coupled to an analog to digital converter 142a the output of which may be sampled by a filter 146a to generate the first channel output signal 150a, as shown. The gain and offset adjustment of the magnetic field signals 124a-124c may be performed during a calibration mode of operation following power-on of the sensor.

In the illustrative embodiment, the circuitry of the second differential channel 130b is substantially identical to the first differential channel 130a, but responds to signals from a second pair of magnetic field sensing elements, here sensing elements 24b and 24c. Thus, the second differential channel 130b is shown to include summation element 134b, preamplifier 138b, analog to digital converter 142b, and filter 146b and provides the second channel output signal 150b.

The third differential channel 130c includes a summation element 152 that provides the third channel output signal 150c as the difference between the first channel output signal 150a and the second channel output signal 150b. Thus, in the illustrative embodiment in which the first Channel output signal 150a is based on a difference between the magnetic field signals from elements 24a and 24b and the second channel output signal 150b is based on a difference between the magnetic field signals from elements 24b and 24c, the third channel output signal 150c is based on a difference between the magnetic field signals from elements 24c and 24a. Although the third differential channel 130c shares circuitry with the first and second differential channels 130a and 130b in the illustrative embodiment, it will be appreciated that the third Channel 130c may alternatively include dedicated circuit elements similar to those of the first and second differential channels, A combining element 160 is responsive to at least two of the first, second, and third magnetic field signals 124a, 124b, and 124c to generate a combined signal 164 based on the magnetic field signals 124a-124c. In an embodiment, combining element 160 may take the form of a summation element to perform a simple summation operation by which the first, second, and third magnetic field signals 124a, 124b, and 124c are summed to generate combined signal 164 in the form of a summation signal. Alternatively, combining element 160 may perform a different and in some embodiments more complex mathematical operation to combine signals 124a, 124b, and/or 124c to generate the signal 164, for example using a combination of one or more algebraic functions like addition, subtraction, multiplication and/or Furthermore, combining element 160 may perform a weighting function by which signals 124a, 124b, and 124c are weighted and summed and/or weighted and combined in a different manner, Signal 164 may be processed in a manner similar to the processing provided by the first and second differential channels by circuitry 172 that may be referred to as direction channel circuitry. Thus, the signal 164 may be amplified by an amplifier 166, converted into a digital signal by analog to digital converter 170 and filtered by a filter 174 to provide a combined signal 176 based on the magnetic field signals 124a-124c. An additional optional input 162 to the combining circuit 160, Vbaseline, may be provided to represent a systematic offset for subtraction by the combining circuit 160.

Control circuitry 180, responsive to the combined signal 176 and to at least one of the first, second, and third channel output signals 150a-150c, is configured to generate a sensor output signal 194 that is indicative of a speed of motion and a direction of motion of the target independent of an installation angle of the magnetic, field sensor 20 relative to the target. The control circuitry 180 includes an orientation independent speed detector 184 that is responsive to id the first, second, and third channel output signals 150a, 150b, 150c to generate a speed signal 186 (referred to herein alternatively as a speed channel signal 186) having edges indicative of motion of the target. An orientation independent direction detector 188 is responsive to the speed channel signal 186 and to the combined signal 176 to generate a direction indicator signal 190 indicative of a direction of motion of the target. An output signal generator 192 generates a sensor output signal 194 based on the speed channel signal 186 and the direction indicator signal 190.

The sensor output signal 194 may be a voltage signal containing pulses at a frequency or rate indicative of the speed of motion of the target and pulse widths indicative of the direction of motion of the target, as will be described. In the illustrative embodiment, the sensor output signal 194 is used to generate a further sensor output signal 200 in the form of current pulses on power (VCC) and ground (GND) connections, in what is sometimes referred to as a two-wire configuration. To this end, an output current generator 196 responds to the sensor output signal 194 to generate the required current pulses. An electrostatic discharge (ESD) protection device 198 may be coupled across the VCC and GND connections. It will be appreciated that various formats and protocols are possible for conveying information including direction information in the sensor output signal. Other illustrative signal formats are described in a U.S. Pat. No. 8,624,588 entitled "Apparatus and Method for Providing an Output Signal Indicative, of a Speed of Rotation and a Direction of Rotation as a Ferromagnetic Object" which is assigned to the Assignee of the subject disclosure.

The sensor 20 may include additional supporting circuitry, such as a regulator 204 including a Power on Reset function to keep the device reset until a predetermined minimum voltage is achieved between Vcc and ground, an oscillator 206 providing suitable clock signals to various circuit elements, and a Vcc programming block 208 which can be used to program various aspects of operation, such as the definition of positive and negative rotation directions. Fuses 210 may he alternatively or additionally be provided to permit programmability of various circuit functions such as the rotation direction definition.

As shown in FIGS. 1 and 3, the illustrated magnetic field sensing elements 24a-24c are ID arranged in a triangular configuration. The spacing between each of the first, second, and third magnetic field sensing elements 24a-24c may be substantially the same, as shown in the illustrated embodiment, or alternatively, the spacing between elements may vary. The first and second elements 24a and 24b define a first sensing axis 122 (labeled in FIG. 3), the second and third elements 24b and 24c define a second sensing axis 128, and the third and first elements 24c and 24a define a third sensing axis 132. Here, each of the first, second, and third sensing axes 122, 126, and 132 are at a substantially sixty-degree angle with respect to each other to form an equilateral triangle. Other configurations of the three sensing elements are also possible while still providing the magnetic field signals 124a, 124b, and 124c for processing to generate the orientation independent speed channel signal 186 and direction indicator signal 192. Furthermore, while the illustrative embodiment includes three magnetic field sensing elements 24a, 24b, and 24c, it should be appreciated that three or more magnetic field sensing elements can be used. Examples of magnetic field sensing element configurations containing more than three elements are shown in a U.S. Pat. No. 8,729,892 entitled "Differential Magnetic Field Sensor Structure for Orientation Independent Measurement" which patent is assigned to the Assignee of the subject application and incorporated herein by reference in its entirety.

Sensor 20 may be provided in the form of an integrated circuit that has an active surface (coinciding with the face 20a opposing the target profile 12a as shown in FIG. 1) in which the sensing elements 24a-24c and other circuitry is formed. Furthermore, such integrated circuit can include a single substrate or multiple substrates in one or more sensor packages.

The speed detector 184 may take various forms to generate the orientation independent speed channel signal 186 based on a comparison of one or more of the differential channel output signals 150a-150c with a threshold signal, so that the speed channel signal 186 has edges indicative of motion of the target. The speed detector 184 may include a signal generator 184a and a detector 184b. The signal generator 184a operates to generate an orientation independent speed signal 185 based on the channel output signals 150a-150c. The signal 185 is said to be independent of the orientation angle (i.e., installation angle) of the sensor and thus, is much the same as that of the differential signal that would be seen if the sensing axis 122, 128, 132 of the selected channel were aligned with the target profile reference axis 14 (FIG. 1).

In one embodiment, the signal generator.184a includes a comparator or otherwise performs a comparison function whereby the amplitudes of each of the three channel output signals 150a-150c are compared to one another and the one of the signals with the greatest amplitude is used to provide the speed signal 185. The signal generator 184a operates to determine the amplitudes of the channel output signals 150a-150c (such as by obtaining positive and negative peak values for each signal by acquiring the channel output signals over at least one period) and compares the amplitudes, for example, by determining the absolute value of each of the signals 150a-150c and comparing the absolute values to determine which signal has the greatest amplitude. The channel output signal having the greatest amplitude may be selected to provide the signal 185 to the detector 184b as described in the above-referenced U.S. Pat. No. 8,729,892. As an alternative to selecting the channel output signal having the greatest amplitude, the sir al generator 184a may generate signal 185 as a mathematical combination of the channel output signals 150a-150c and normalize the resulting signal to be independent of orientation angle, as is also described in the above-referenced U.S. Pat. No. 8,729,892.

The orientation independent speed signal 185 is coupled to the detector 184b that may include a peak detector to generate the speed channel signal 186. Peak detectors track the input signal 185 provided to the detector and provide an output signal that switches when the input signal crosses a threshold level. More particularly, the detector 184b can be a peak-to-peak percentage detector in which the threshold level is based on a peak-to-peak level of the signal 185. One such peak-to-peak percentage detector is described in uses. Pat. No. 5,917,320 entitled "Detection of Passing Magnetic Articles While Periodically Adapting Detection Threshold," which is assigned to the assignee of the present disclosure and incorporated herein by reference in its entirety. Alternatively, the detector 184b can be a slope-activated detector (sometimes referred to as a peak referenced detector) in which the threshold level is provided at some offset level from the peaks and/or valleys of the input signal 185 such that the resulting speed channel signal 186 transitions when the input signal 185 varies from its peak or valley by more than the predetermined offset amount. One such slope-activated detector is described in U.S. Pat. No. 6,091,239 entitled "Detection of Passing Magnetic Articles with a Peak Referenced Threshold Detector," which is assigned to the assignee of the present disclosure and incorporated herein by reference in its entirety. As a further alternative, the detector 184b may be provided in the form of a comparator or processor performing a comparison function that operates to compare the input signal 185 to a predetermined, fixed threshold level. One such illustrative fixed threshold detector is described in a U.S. Patent Application Publication No. US-2012-0249126 entitled "Circuits and Methods for Motion Detection" which is assigned to the Assignee of the present disclosure and incorporated herein by reference in its entirety, The orientation independent direction detector 188 responds to the speed channel signal 186 and to the combined signal 176 (FIG. 3) to generate the direction indicator signal 190 in a manner illustrated by the flow diagram of FIG. 4 and the example waveforms of FIGS. 5 and 6. The direction detector 188 includes a detector 188a (that may be the same as or similar to the detector 184b and thus may take the form of a peak detector or a comparator for example) to generate a direction signal 178 (referred to herein alternatively as the direction channel signal) in the form of a binary signal having transitions based on a comparison of the combined signal 176 to a threshold level. In an embodiment, the detector 188a is a peak-to-peak percentage detector with a threshold level related to the peak-to-peak amplitude of the combined signal 176. An encoder 188b responds to the direction channel signal 178 and to the speed channel signal 186 to generate the direction indicator signal 190, as will be described.

The output signal generator 192 generates the sensor output signal 194 based on the speed channel signal 186 and the direction indicator signal 190. The sensor output signal 194 is indicative of both the speed of rotation of the target and the direction of rotation. The speed information may be conveyed by the frequency or rate of pulses and the direction information may be conveyed in different ways. As one example (illustrated below in FIGS. 5 and 6), direction information may be conveyed in the form of different pulse widths. In other embodiments, the output signal 194 is provided in the form of a digital word representative of the speed of rotation and the direction of rotation of the target. It will be appreciated however that various schemes are possible to communicate direction information in the output signal, such as those described in U.S. Pat. No. 8,624,588 entitled "Apparatus and Method for Providing an Output Signal Indicative of a Speed of Rotation and a Direction of Rotation as a Ferromagnetic Object" which is assigned to the assignee of the present disclosure and incorporate herein by reference in its entirety.

The output current generator 196 provides two levels of current representing two digital output states of the sensor. Since the output current is provided on the supply/ground lines, a device with the illustrated current source output structure 196 is sometimes referred to as a "two-wire"

device. Alternatively, the output current generator 196 could be eliminated and the output signal generator 192 may include a totem-pole push-pull or open drain, open collector output configuration. This type of configuration is typical of devices that are sometimes referred to as "three-wire" devices. In such sensors, the output signal 194 could be encoded in a protocol like Inter-Integrated Circuit (I²C), Serial. Peripheral interface (SPI), Single Edge Nibble Transmission (SENT) or other protocols used in automotive, industrial or consumer applications.

Figure 4:
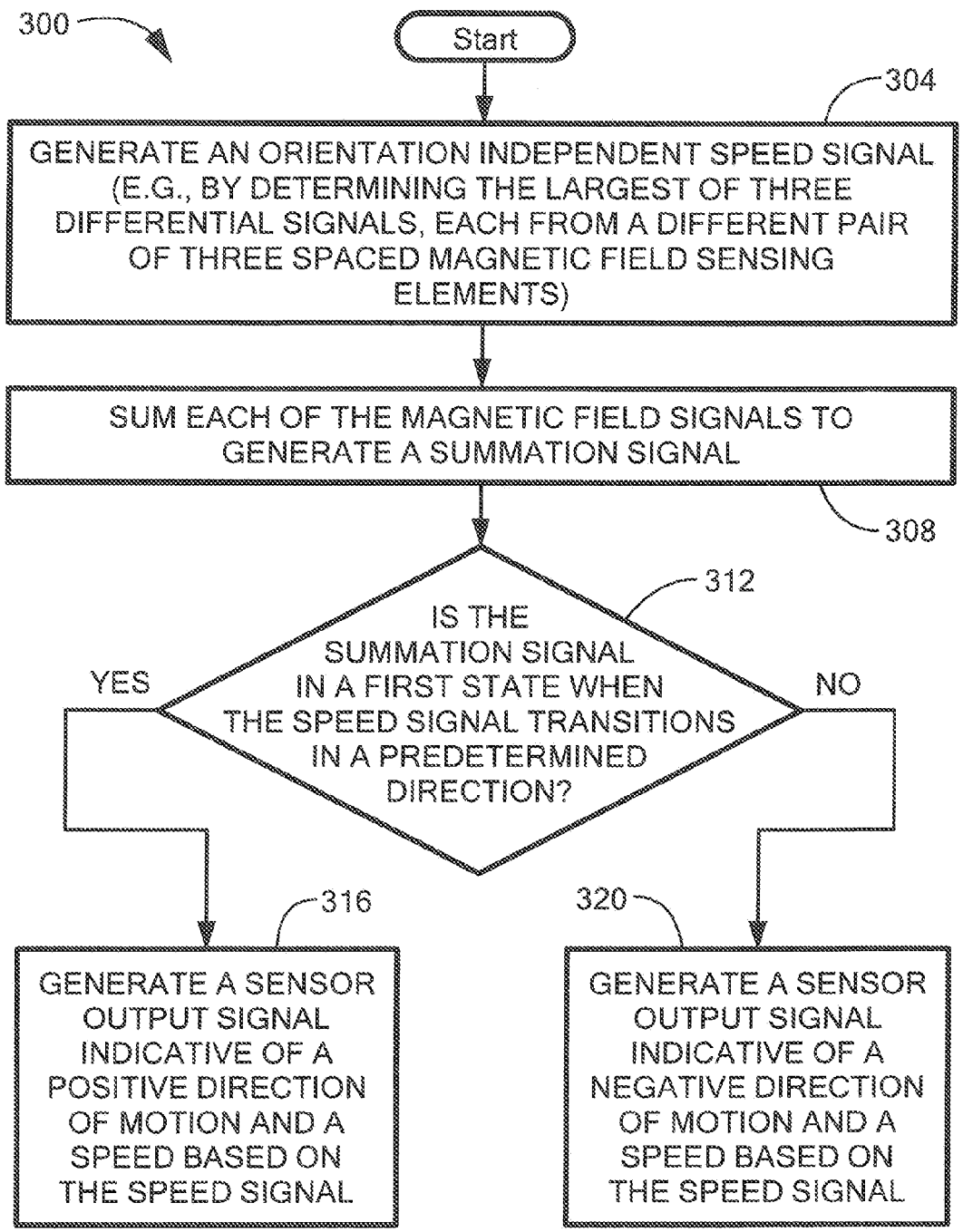
FIG. 4 is a flow diagram illustrating operation of the orientation angle independent speed and direction circuitry of FIG. 3.

In the illustrative embodiment, the control circuitry 180 is implemented in the digital domain, following analog-to-digital conversion. Accordingly, the control circuitry 180 may be implemented with digital signal processor circuitry, state machine circuitry, software or other suitable circuitry or techniques. Alternatively, it will be appreciated that more or even all of the sensor circuitry can be implemented with analog signals and circuitry, FIG. 4 shows a flowchart corresponding to processes implemented by the sensor 20 of FIG. 3. Rectangular elements, herein denoted "processing blocks," represent computer software instructions or groups of instructions. Diamond shaped elements, herein denoted "decision blocks," can represent computer software instructions, or groups of instructions, which affect the execution of the computer software instructions represented by the processing blocks. Alternatively, the processing and decision blocks represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the disclosure. Thus, unless otherwise stated, the blocks described below are unordered meaning that, when possible, the steps can be performed in any convenient or desirable order.

Referring to FIG. 4, an illustrative process 300 as may be performed by the orientation independent direction detector 188 (FIG. 3) with other portions of the magnetic field sensor 20, commences at block 304, by generating an orientation independent speed channel signal (signal 186. FIG. 3). As noted above, in one embodiment, speed channel signal 186 is provided in the form of whichever channel output signal 150a-150c has the largest amplitude over a few cycles (e.g., gear teeth). In a block, 308, each of the magnetic field signals 124a-124c is summed by a summing element 160, processed by direction channel circuitry 172, and detector 188a to generate direction channel signal 178. More particularly, detector 188a (that may be the same as or similar to the detector 184b and thus may take the form of a peak detector or a comparator) generates a direction channel signal 178 having transitions based on a comparison of the combined signal 176 to a threshold. It will be appreciated that in some embodiments, blocks 304 and 308 may occur in parallel for example.

In decision block 312, as may be performed by encoder 188b (FIG. 3), it is determined if the direction channel signal 178 is in a first state when the speed channel signal 186 transitions in a predetermined direction. If the direction channel signal 178 is in a first state (e.g., at a logic high level) when the speed channel signal 186 transitions in a predetermined direction (e.g., a positive-going transition), then the direction indicator signal 190 is generated to indicate a positive direction of motion of the target in block 316; whereas, if the direction channel signal 178 is not in the first state when the speed channel signal 186 transitions in the predetermined direction, then the direction indicator signal 190 is generated to indicate a negative direction of motion of the target in block 320. More particularly, in block. 316, the sensor output signal 194 or 200 may be generated to indicate both the positive direction of motion of the target and the speed of motion of the target and in block 320, the sensor output signal 194 or 200 may be generated to indicate both the negative direction of motion of the target and the speed of motion of the target.

Figure 5:
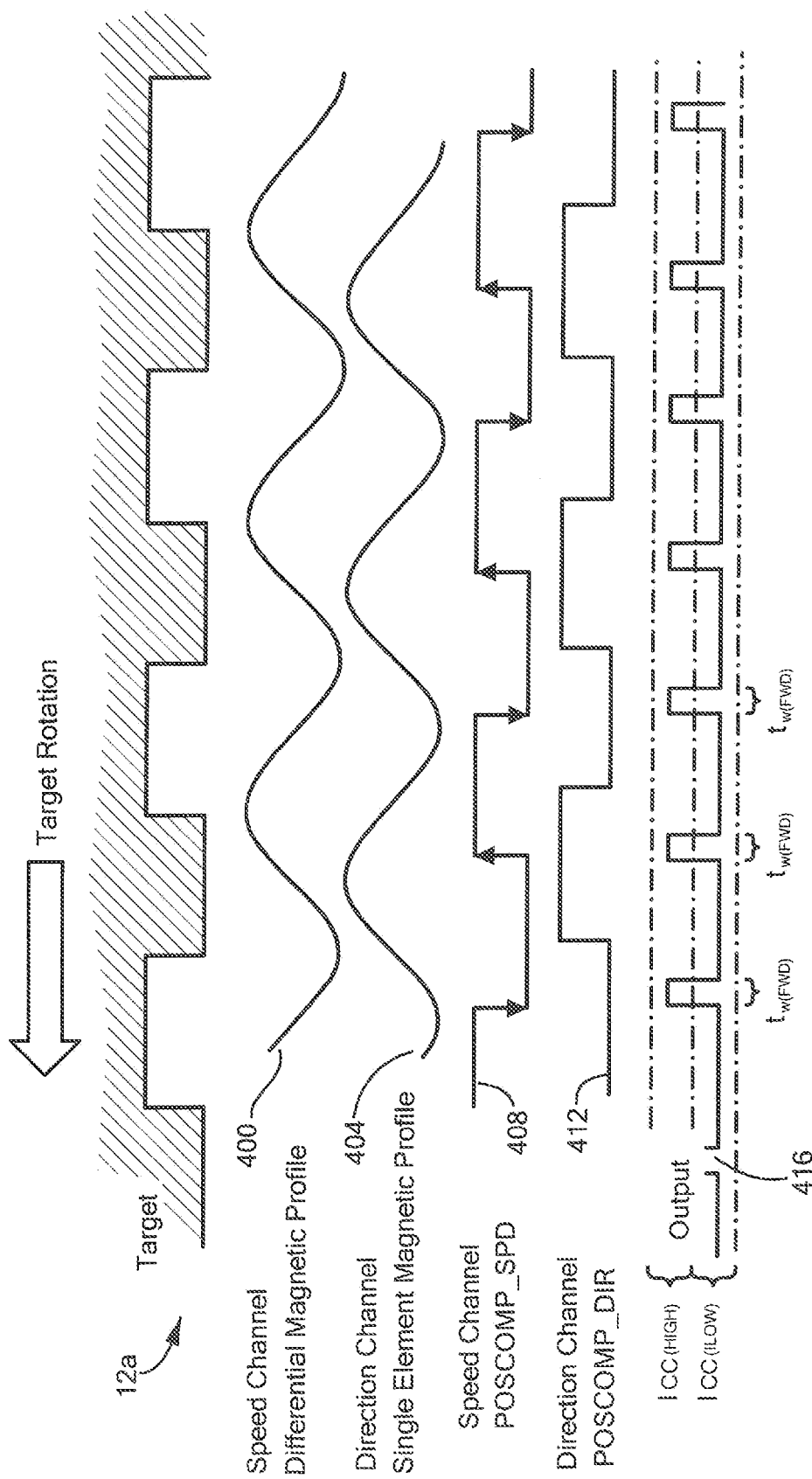
FIG. 5 shows several illustrative waveforms associated with the magnetic field sensor of FIG. 1-3 when the target is moving in a first direction.

Operation of the orientation independent direction detector 188 is further illustrated by example waveforms in FIGS. 5 and 6. Each of FIGS. 5 and 6 shows a target profile 12a (FIG. 1) rotating in relation to a resulting speed channel magnetic field signal 400, 400' and a direction channel magnetic field signal 404, 404', respectively. FIG. 5 shows the target profile 12a rotating in a first direction (e.g., forward or positive direction) and FIG. 6 shows the target profile 12b rotating in a second direction (e.g., reverse or negative direction). The speed channel magnetic field signal 400, 400' corresponds to the one of the differential channel output signals (i.e., signals 150a-150c) that has the greatest amplitude (as determined in block 304 of FIG. 4 and as provided by signal 185 in FIG. 3). The direction channel magnetic field signal 404, 404' corresponds to the combined signal 176 of FIG. 3 and thus, may be based on a combination of the magnetic field signals 1.24a-124c from each of the magnetic field sensing elements 24a 24c, respectively, The speed channel magnetic field signal 400, 400' is processed by a detector (e.g., detector 184b of FIG. 3) to generate the speed channel signal 408, 408' (POSCOMP_SPD) that may be the same as or similar to the speed channel signal 186 of FIG. 3. Thus, the speed channel signal 408, 408' is a binary signal having transitions that correspond to a comparison of the speed channel magnetic field signal 400, 400' to a threshold by the detector 184b. The rate of the pulses of the speed channel signal 408, 408' indicates the target rotation speed.

The combined signal 404, 404 is processed by a detector 188 (e.g., detector 188a of FIG. 3) to generate the direction Channel signal 412, 412' (POSCOMP_DIR) that may be the same as or similar to the direction channel signal 178 of FIG. 3. Thus, the direction channel signal 412, 412' is a binary signal having transitions that correspond to a comparison of the direction magnetic field signal 404, 404' to a threshold by the detector 188a.

The sensor output signal 416, 416 (which may be the same as or similar to the output signal 200 of FIG. 3) is provided with a pulse rate indicative of the speed of rotation of the target and an indication of the direction of rotation. As noted above, various schemes are possible for conveying direction information. In the illustrated embodiment, the direction of rotation is conveyed in the form of a predetermined pulse width. As one particular example, a positive direction of rotation may correspond to a nominal pulse width of 45 μsec and a negative direction of rotation may correspond to a nominal pulse width of 90 μsee.

By operation of the encoder 188b of FIG. 3 according to block 312 of FIG. 4 and as shown in FIG. 5, if the direction channel signal 412 is in a first state (i.e., greater than a predetermined threshold) when the speed channel signal 408 transitions in a first predetermined direction (i.e., a positive-going transition) or is in a second state (i.e., less than a predetermined threshold) when the speed signal 408 transitions in a second predetermined direction (i.e., negative-ping transition), then the target is determined to be rotating in a first (e.g., a positive or forward) direction; whereas as is shown in FIG. 6, if the direction channel signal 412' is in a second state (i.e., less than a predetermined threshold) when the speed channel signal 408' transitions in the first predetermined direction (i.e., a positive-going transition) or is in a first state (i.e., greater than a predetermined threshold) when the speed channel signal 408' transitions in the second predetermined direction (i.e., negative-going transition), then the target is determined to be rotating in a second (e.g., a negative or reverse) direction.

The orientation independent magnetic field sensor 20 with its multi-channel arrangement of sensing elements, as described above, may be used in a variety of applications. It is particularly well-suited to use in rotational speed detection and timing control in automotive applications such as in anti-lock braking systems (ABS), transmissions and crankshafts, among others. For example, rotational speed information produced by a sensor may be used by speedometers, tachometers, on-board computers, tachographs (also known as chronotachographs), and the like.

Although the orientation angle independent techniques and designs have been illustrated herein with reference to rotary sensing, they are applicable to linear movement sensing as well. If the orientation angle is determined, the angle information could be provided as feedback to the user (to indicate a misalignment condition), or to other circuitry or processing elements for compensation, calibration or other purposes. The orientation angle independent techniques and designs described herein may be suitable for use in any magnetically noisy environment, as they allow for a clean signal independent of orientation of sensor relative to a target and independent of DC magnetic perturbations.

All references cited herein are hereby incorporated herein by reference in their entirety.

Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor comprising at least first, second, and third spaced magnetic field sensing elements, each providing a respective first, second, and third magnetic field signal having an amplitude proportional to a magnetic field associated with a target, comprising:
   a first differential channel comprising a first pair of the first, second, and third magnetic field sensing elements and configured to provide a first channel signal based on a difference between the magnetic field signals provided by the first pair of magnetic field sensing elements;
   a second differential channel comprising a second pair of the first, second, and third magnetic field sensing elements and configured to provide a second channel signal based on a difference between the magnetic field signals provided by the second pair of magnetic field sensing elements;
   a third differential channel comprising a third pair of the first, second, and third magnetic field sensing elements and configured to provide a third channel signal based on a difference between the magnetic field signals provided by the third pair of magnetic field sensing elements;
   a combining element to generate a combined signal based on the first, second, and third magnetic field signals; and
   control circuitry, coupled to receive the combined signal and coupled to receive the first, second, and third channel signals, to generate a sensor output signal that is indicative of a speed of motion and a direction of motion of the target and that is independent of an installation angle of the magnetic field sensor relative to the target.

2. The magnetic field sensor of claim 1 wherein the combining element comprises a summation element and the combined signal comprises a summation signal based on a summation of the first, second, and third magnetic field signals.

3. The magnetic field sensor of claim 1 wherein the combining element is configured to perform one or more algebraic operations on at least two of the first, second, and third magnetic field signals.

4. The magnetic field sensor of claim 1 wherein the control circuitry comprises an orientation independent speed detector to generate a speed channel signal in response a selected one of the first, second, and third channel signals and an orientation independent direction detector responsive to the combined signal and to the speed channel signal to generate a direction indicator signal.

5. The magnetic field sensor of claim 4 wherein the orientation independent direction detector comprises a detector responsive to the combined signal to generate a direction channel signal and an encoder responsive to the speed channel signal and to the direction channel signal to generate the direction indicator signal indicating a first direction of motion of the target when the direction channel signal is in a first state as the speed channel signal transitions in a predetermined direction and indicating a second direction of motion of the target when the direction channel signal is in a second state as the speed channel signal transitions in the predetermined direction.

6. The magnetic field sensor of claim 5 wherein the direction channel signal is in the first state when the direction channel signal is greater than a predetermined threshold and wherein the direction channel signal is in a second state when the direction channel signal is less than the predetermined threshold.

7. The magnetic field sensor of claim 6 wherein the predetermined threshold is proportional to a peak-to-peak amplitude of the one of the first, second, and third channel signals with the largest peak-to-peak amplitude.

8. The magnetic field sensor of claim 4 wherein the orientation independent speed detector comprises a peak-to-peak signal detector and a comparator configured to detect which of the first, second, and third channel signals has a largest peak-to-peak amplitude and wherein the one of the first, second, and third channel signals with the largest peak-to-peak amplitude is selected to provide the speed channel signal.

9. The magnetic field sensor of claim 1 wherein one of the magnetic field sensing elements in each of the first and second pairs of magnetic field sensing elements is shared by the first and second differential channels.

10. The magnetic field sensor of claim 1 wherein none of the magnetic field sensing elements in each of the first and second pairs of magnetic field sensing elements is shared by the first and second differential channels.

11. The magnetic field sensor of claim 1 wherein the spacing between each of the first, second, and third magnetic field sensing elements is substantially the same.

12. The magnetic field sensor of claim 1 wherein the first and second magnetic field sensing elements define a first axis and wherein the second and third magnetic field sensing elements define a second axis and wherein the first and second axes are at a substantially sixty degree angle with respect to each other.

13. The magnetic field sensor of claim 1 wherein the sensor output signal has transitions occurring at a frequency that is indicative of the speed of motion of the target and a pulse width that is indicative of the direction of motion of the target.

14. The magnetic field sensor of claim 1 wherein the sensor output signal indicates the speed of motion and the direction of motion of the target encoded in a protocol.

15. The magnetic field sensor of claim 14 wherein the protocol is selected from Inter-Integrated Circuit ($I^2C$), Serial Peripheral Interface (SPI), Single Edge Nibble Transmission (SENT).

16. The magnetic field sensor of claim 1 wherein each of the magnetic field sensing elements is a selected one of a Hall-effect element, a magnetoresistance (MR) element, or other type of magnetic field sensitive element.

17. The magnetic field sensor of claim 1 wherein material used to implement each of the magnetic field sensing elements is a selected one of a IV-type semiconductor material or a III-V-type semiconductor material.

18. A method for sensing a speed and direction of motion of a target relative to a magnetic field sensor, comprising:
providing at least first, second, and third spaced magnetic field sensing elements, each providing a respective first, second, and third magnetic field signal having an amplitude proportional to a magnetic field associated with the target;
processing a first pair of the first, second, and third magnetic field signals to provide a first channel signal based on a difference between the first pair of the first, second, and third magnetic field signals;
processing a second pair of the first, second, and third magnetic field signals to provide a second channel signal based on a difference between the second pair of the first, second, and third magnetic field signals;
processing a third pair of the first, second, and third magnetic field signals to provide a third channel signal based on a difference between the third pair of the first, second, and third magnetic field signals;
combining at least two of the first, second, and third magnetic field signals to generate a combined signal; and
providing an indication of the speed and direction of motion of the target in response to a selected one of the first, second, and third channel signals and the combined signal, wherein the speed and direction indication is independent of an installation angle of the magnetic field sensor relative to the target.

19. The method of claim 18 wherein combining at least two of the first, second, and third magnetic field signals comprises summing the first, second, and third magnetic field signals.

20. The method of claim 18 wherein combining at least two of the first, second, and third magnetic field signals comprises performing one or more algebraic operations on at least two of the first, second, and third magnetic field signals.

21. The method of claim 18 further comprising:
determining which of the first, second, and third channel signals has a largest peak-to-peak amplitude to provide the selected one of the first, second, and third channel signals; and
providing the speed and direction indication in response to the combined signal and the selected one of the first, second, and third channel signals.

22. The method of claim 21 wherein providing the speed and direction indication comprises:
using the combined signal to generate a direction channel signal;
using the one of the first, second, and third channel signals having the largest peak-to-peak amplitude to generate a speed channel signal;
indicating a first direction of motion of the target when the direction channel signal is in a first state as the speed channel signal transitions in a predetermined direction; and
indicating a second direction of motion of the target when the direction channel signal is in a second state as the speed channel signal transitions in the predetermined direction.

23. The method of claim 18 wherein providing the speed and direction indication comprises providing a signal having a pulse rate indicative of the speed of motion of the target and a pulse width indicative of the direction of motion of the target.

24. The method of claim 18 wherein providing the speed and direction indication comprises encoding the speed and direction indication in a protocol.

25. The method of claim 24 wherein the protocol is selected from Inter-Integrated Circuit ($I^2C$), Serial Peripheral Interface (SPI), Single Edge Nibble Transmission (SENT).

26. The method of claim 18 wherein providing at least first, second, and third spaced magnetic field sensing elements comprises positioning first, second, and third spaced magnetic field sensing elements in an equilateral triangle configuration.

27. The method of claim 18 wherein providing at least first, second, and third spaced magnetic field sensing elements comprises providing at least first, second, and third magnetic field sensing elements as a selected one of a Hall-effect element and a magnetoresistance (MR) element.

28. A magnetic field sensor comprising at least first, second, and third spaced magnetic field sensing elements, each providing a respective first, second, and third magnetic field signal having an amplitude proportional to a magnetic field associated with a target, comprising:
a first differential channel comprising a first pair of the first, second, and third magnetic field sensing elements and configured to provide a first channel signal based on a difference between the magnetic field signals provided by the first pair of magnetic field sensing elements;
a second differential channel comprising a second pair of the first, second, and third magnetic field sensing elements and configured to provide a second channel signal based on a difference between the magnetic field signals provided by the second pair of magnetic field sensing elements;
a third differential channel comprising a third pair of the first, second, and third magnetic field sensing elements and configured to provide a third channel signal based on a difference between the magnetic field signals provided by the third pair of magnetic field sensing elements;

a combining element to generate a combined signal based on the first, second, and third magnetic field signals; and control circuitry, responsive to the combined signal and to at least one of the first, second, and third channel signals, to generate a sensor output signal that is indicative of a speed of motion and a direction of motion of the target and that is independent of an installation angle of the magnetic field sensor relative to the target, wherein the control circuitry comprises an orientation independent speed detector to generate a speed channel signal in response at least one of the first, second, and third channel signals and an orientation independent direction detector responsive to the combined signal and to the speed channel signal to generate a direction indicator signal.

29. A method for sensing a speed and direction of motion of a target relative to a magnetic field sensor, comprising:

providing at least first, second, and third spaced magnetic field sensing elements, each providing a respective first, second, and third magnetic field signal having an amplitude proportional to a magnetic field associated with the target;

processing a first pair of the first, second, and third magnetic field signals to provide a first channel signal based on a difference between the first pair of the first, second, and third magnetic field signals;

processing a second pair of the first, second, and third magnetic field signals to provide a second channel signal based on a difference between the second pair of the first, second, and third magnetic field signals;

processing a third pair of the first, second, and third magnetic field signals to provide a third channel signal based on a difference between the third pair of the first, second, and third magnetic field signals;

combining at least two of the first, second, and third magnetic field signals to generate a combined signal;

determining which of the first, second, and third channel signals has a largest peak-to-peak amplitude; and providing an indication of the speed and direction of motion of the target in response to the combined signal and the largest of the first, second, and third channel signals, wherein the speed and direction indication is independent of an installation angle of the magnetic field sensor relative to the target.

* * * * *

UNITED STATES PATENT AND TRADEMARK OFFICE
CERTIFICATE OF CORRECTION

PATENT NO. : 9,605,975 B2  
APPLICATION NO. : 14/731967  
DATED : March 28, 2017  
INVENTOR(S) : Andrea Foletto et al.

Page 1 of 1

It is certified that error appears in the above-identified patent and that said Letters Patent is hereby corrected as shown below:

On the Title Page

Item (73) delete "ALLEGRO MICORSYSTEMS, LLC," and replace with --ALLEGRO MICROSYSTEMS, LLC,--.

Signed and Sealed this  
Sixth Day of June, 2017

Michelle K. Lee  
*Director of the United States Patent and Trademark Office*